(12) United States Patent
Byeon

(10) Patent No.: US 7,778,100 B2
(45) Date of Patent: Aug. 17, 2010

(54) INTERNAL VOLTAGE GENERATION CIRCUIT OF SEMICONDUCTOR MEMORY DEVICE

(75) Inventor: Sang Jin Byeon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 79 days.

(21) Appl. No.: 12/272,944

(22) Filed: Nov. 18, 2008

(65) Prior Publication Data

US 2009/0140793 A1 Jun. 4, 2009

Related U.S. Application Data

(62) Division of application No. 11/648,283, filed on Dec. 29, 2006, now Pat. No. 7,468,928.

(30) Foreign Application Priority Data

Jan. 13, 2006 (KR) ...... 10-2006-0003975

(51) Int. Cl.
 *G11C 5/14* (2006.01)
(52) U.S. Cl. ............... 365/226; 365/189.09

(58) Field of Classification Search ............... 365/226, 365/189.09, 189.11, 222
See application file for complete search history.

(56) References Cited

U.S. PATENT DOCUMENTS

| 6,418,075 B2 * | 7/2002 | Shimano et al. ............. 365/227 |
| 6,868,026 B2 * | 3/2005 | Fujioka ...................... 365/222 |
| 7,319,361 B2 * | 1/2008 | Jin ............................. 327/543 |

FOREIGN PATENT DOCUMENTS

| KR | 1995-0024335 A | 8/1995 |
| KR | 2000-0045396 A | 7/2000 |

* cited by examiner

*Primary Examiner*—Anh Phung
(74) *Attorney, Agent, or Firm*—Ladas & Parry LLP

(57) ABSTRACT

An internal voltage generation circuit of a semiconductor memory device controls a dead zone voltage, in which the driving unit that supplies a power supply voltage, does not need to operate. An internal voltage having a dead zone is determined by first and second driving signals based on a level of a reference voltage, and by selectively supplying first and second voltages by means of the first and second driving signals.

9 Claims, 13 Drawing Sheets

INTERNAL VOLTAGE GENERATION CIRCUIT OF SEMICONDUCTOR MEMORY DEVICE

FIELD OF THE INVENTION

The present invention relates to a semiconductor memory device, and more particularly to an internal voltage generation circuit of a semiconductor memory device for creating internal voltage required by a semiconductor device.

DESCRIPTION OF THE PRIOR ART

As is generally known in the art, a bit line precharge voltage used for bit line precharge in a dynamic random access memory (DRAM) has a voltage level equal to one-half of the voltage stored in a semiconductor memory cell. When the bit line precharge voltage has a voltage level equal to one-half of the voltage stored in a semiconductor memory cell, that is, one-half of a core voltage, as described above, this enables minimization of power consumption for an equalizing operation.

Also, a cell plate voltage, which is a voltage connected to a reference terminal of a memory cell capacitor, has a voltage level equal to one-half a core voltage, like the bit line precharge voltage.

When the cell plate voltage has a voltage level equal to one-half the core voltage, as described above, this enables one-half the core voltage to be applied between both terminals of the memory cell capacitor, regardless of a data voltage stored in a memory cell, thereby securing reliability of the memory cell capacitor.

A conventional internal voltage generation circuit for generating internal voltages, such as a bit line precharge voltage, a cell plate voltage, etc., used in a memory device may be constructed as shown in FIG. 1.

In the circuit shown in FIG. 1, the conventional internal voltage generation circuit 10 outputs driving signals UP_DRV1 and DOWN_DRV1 by dividing a voltage formed between a power supply voltage VCC and a ground voltage VSS through a driving signal generation unit 20. Then, the driving unit 20 supplies a power supply voltage VCC by the driving signal UP_DRV1 and supplies a ground voltage VSS by the driving signal DOWN_DRV1, and creates an internal voltage VOUT1 having a voltage level between the power supply voltage VCC and ground voltage VSS.

The driving unit 20 may include a MOS transistor (not illustrated) for increasing the level of the internal voltage VOUT1 by the driving signal UP_DRV1, and a MOS transistor (not illustrated) for decreasing the level of the internal voltage VOUT1 by the driving signal DOWN_DRV1. Through the operation of such MOS transistors in the driving unit 20, the internal voltage VOUT1 is created on the basis of the half level between the power supply voltage VCC and ground voltage VSS, that is, on the basis of one-half of the voltage level of the power supply voltage, and has a predetermined dead zone voltage.

Herein, the range of the "dead zone" voltage is determined according to the driving signals UP_DRV1 and DOWN_DRV1 and the MOS transistors of the driving unit 20, to which the driving signals are input. The dead zone voltage represents a voltage range in which the driving unit 20 does not need to operate, and is typically set around a target level determined by a designer.

When the level of the power supply voltage VCC fluctuates due to the external environment, in order to be out of the dead zone of the internal voltage VOUT1, the voltage levels of the driving signals UP_DRV1 and DOWN_DRV1 are changed corresponding to the change in the level of the power supply voltage VCC, and the power supply voltage VCC or ground voltage VSS is supplied for the internal voltage VOUT1. Accordingly, the internal voltage VOUT1 can be maintained as a level within a predetermined dead zone.

As described above, according to the conventional internal voltage generation circuit, an internal voltage VOUT1 having a voltage level between the power supply voltage VCC and the ground voltage VSS is created, and the internal voltage VOUT1 is maintained to have a predetermined dead zone by the operation of the driving unit 20, to which the driving signals UP_DRV1 and DOWN_DRV1 are input.

A normal operation of a memory device causes a large change in the level of the voltage used to create an internal voltage, such as a power supply voltage or core voltage. Therefore, with respect to such a normal operation, it is preferred to apply a narrow dead zone. However, a memory operation having a long refresh period, such as a self-refresh operation, does not cause a large change in the voltage levels of the power supply voltage and core voltage. Therefore, in the self-refresh operation and the like, it is unnecessary to maintain a narrow dead zone. In this case, when a narrow dead zone is formed, the number of turn-on times of MOS transistors included in the driving unit 20 is increased, thereby causing unnecessary current consumption.

That is, the conventional internal voltage generation circuit forms a constant dead zone, regardless of the operations of a memory. Therefore, the conventional internal voltage generation circuit has a problem in that unnecessary current consumption is caused in a memory operation generating only a small change in a voltage level.

SUMMARY OF THE INVENTION

Accordingly, the present invention has been made to solve the above-mentioned problems occurring in the prior art, and an object of the present invention is to provide an internal voltage generation circuit, which can reduce the consumption of current used for the operation of a memory device by flexibly applying the dead zone of an internal voltage according to the operation of the memory.

In order to accomplish this and other objects, there is provided an internal voltage generation circuit including: a driving signal generation unit for generating first and second driving signals based on a reference voltage having a target level between a first voltage and a second voltage; a driving control unit for selectively controlling voltage levels of the first and second driving signals based on a control signal to control a dead zone; and a driving unit for outputting an internal voltage by driving the first and second voltages by means of the first and second driving signals, wherein the dead zone of the internal voltage is changed as the driving control unit controls the first and second driving signals.

The first voltage preferably includes either a core voltage or a power supply voltage, and the second voltage preferably includes a ground voltage.

The driving control unit is preferably provided with a self-refresh signal as the control signal.

The driving control unit preferably includes: a pull-up means for pulling up the first driving signal to a level of the first voltage by means of the control signal; and a pull-down means for pulling down the second driving signal to a level of the second voltage by means of the control signal.

The pull-up means and the pull-down means are preferably enabled or disabled together by the control signal.

The driving control unit preferably includes an inverter for inverting the control signal, and an output of the inverter is provided to either the pull-up means or the pull-down means.

The driving signal generation unit preferably includes: a voltage dividing means for outputting the reference voltage having a level between the first and second voltages; a bias voltage generating means for generating first and second bias voltages for constant current flow by means of the reference voltage; a gate voltage generating means for generating a first gate voltage having a higher voltage level than the reference voltage and a second gate voltage having a lower voltage level than the reference voltage, by means of the reference voltage; and a driving signal generating means for outputting the first and second driving signals, by means of the first and second bias voltages and the first and second gate voltages, wherein levels of the first and second gate voltages are changed according to a change in the levels of the first and second voltages.

The voltage dividing means preferably includes: a first diode to which the first voltage is applied; at least two resistors which are serially connected; and a second diode to which the second voltage is applied, wherein the first diode, the resistors and the second diode are serially connected.

It is preferred that at least one of the first and second diodes includes a PMOS transistor.

The bias voltage generating means preferably includes: a first transistor connected between a power supply having the first voltage and a node having the reference voltage, wherein it is determined based on the reference voltage whether the first transistor is turned on or off; a first current mirror means for generating the first bias voltage which causes constant current flow to a power supply having the second voltage by means of the reference voltage; and a second current mirror means for generating the second bias voltage which causes constant current flow to the power supply having the first voltage by the first current mirror means.

The first current mirror means preferably includes: a second transistor connected between the node having the reference voltage and a node having the first bias voltage, wherein it is determined based on the reference voltage whether the second transistor is turned on or off; a third transistor connected between a node having the first bias voltage and the power supply having the second voltage, wherein it is determined based on the first bias voltage whether the third transistor is turned on or off; fourth and fifth transistors serially connected between a node having the second bias voltage and the power supply having the second voltage, wherein it is determined based on the reference voltage and the first bias voltage whether the fourth and fifth transistors are turned on or off, respectively; and a sixth transistor connected between a node having the second gate voltage and a node having the ground voltage, wherein it is determined based on the first bias voltage whether the sixth transistor is turned on or off.

The second current mirror means preferably includes: a first transistor connected between the node having the first voltage and a node having the second bias voltage, wherein it is determined based on the second bias voltage whether the second transistor is turned on or off; and a first transistor connected between the node having the first voltage and a node having the first gate voltage, wherein it is determined based on the second bias voltage whether the first transistor is turned on or off.

The gate voltage generating means preferably includes: a first transistor connected between a node having the first gate voltage and a node having the reference voltage, wherein it is determined based on the first gate voltage whether the first transistor is turned on or off; and a second transistor connected between a node having the second gate voltage and a node having the reference voltage, wherein it is determined based on the second gate voltage whether the second transistor is turned on or off.

The driving signal generating means preferably includes: a first transistor connected between the power supply having the first voltage and a node receiving the first driving signal, wherein it is determined based on the second bias voltage whether the first transistor is turned on or off; a second transistor connected between the node receiving the first driving signal and a node having the internal voltage, wherein it is determined based on the first gate voltage whether the second transistor is turned on or off; a third transistor connected between the node having the internal voltage and a node receiving the second driving signal, wherein it is determined based on the second gate voltage whether the third transistor is turned on or off; and a fourth transistor connected between the node receiving the second driving signal and the power supply having the second voltage, wherein it is determined based on the first bias voltage whether the fourth transistor is turned on or off.

The driving signal generation unit preferably includes: a first resistor means connected between a power supply having the first voltage and a node receiving the first driving signal; a first diode means connected between the node receiving the first driving signal and a node having the reference voltage; a second diode means connected between the node having the reference voltage and a node receiving the second driving signal; and a second resistor means connected between the node receiving the second driving signal and a power supply having the second voltage, wherein the first driving signal is outputted at a node between the first resistor means and the first diode means, and the second driving signal is outputted at a node between the second resistor means and the second diode means.

The driving unit preferably includes: a first transistor connected between a power supply having the first voltage and a node having the internal voltage, so as to increase a level of the internal voltage according to the first driving signal; and a second transistor connected between a power supply having the second voltage and the node having the internal voltage, so as to decrease the level of the internal voltage according to the second driving signal.

In accordance with another aspect of the present invention, there is provided an internal voltage generation circuit including: a driving control unit for generating first and second driving signals to form a first dead zone, and third and fourth driving signals to form a second dead zone, based on a reference voltage having a target level between a first voltage and a second voltage, and selecting either one pair of the first and second driving signals or one pair of the third and fourth driving signals based on a control signal to control a dead zone; and a driving unit for driving the first and second voltage based on signals selected by the driving control unit, and outputting an internal voltage having a dead zone determined based on the signals selected by the driving control unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
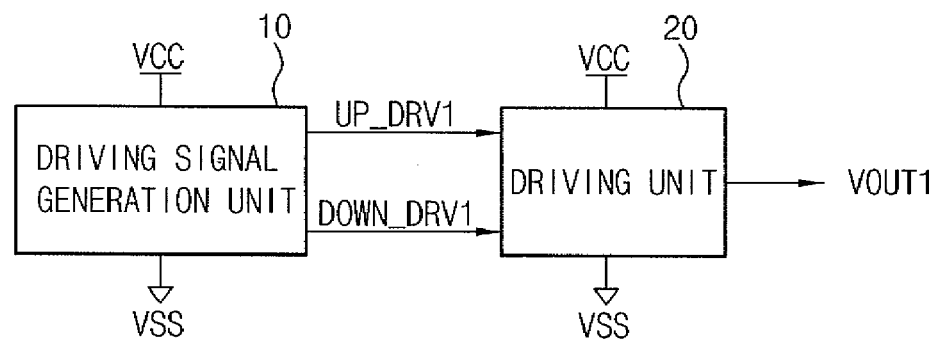
FIG. 1 is a circuit diagram illustrating the construction of a conventional internal voltage generation circuit of a semiconductor memory device.

Hereinafter, preferred embodiments of the present invention will be described with reference to the accompanying drawings. In the following description and drawings, the same reference numerals are used to designate the same or similar components, and so repetition of the description on the same or similar components will be omitted.

An internal voltage generation circuit according to the present invention controls the dead zone of an internal voltage to be either widened or narrowed depending on the operation modes of a memory.

Figure 2:
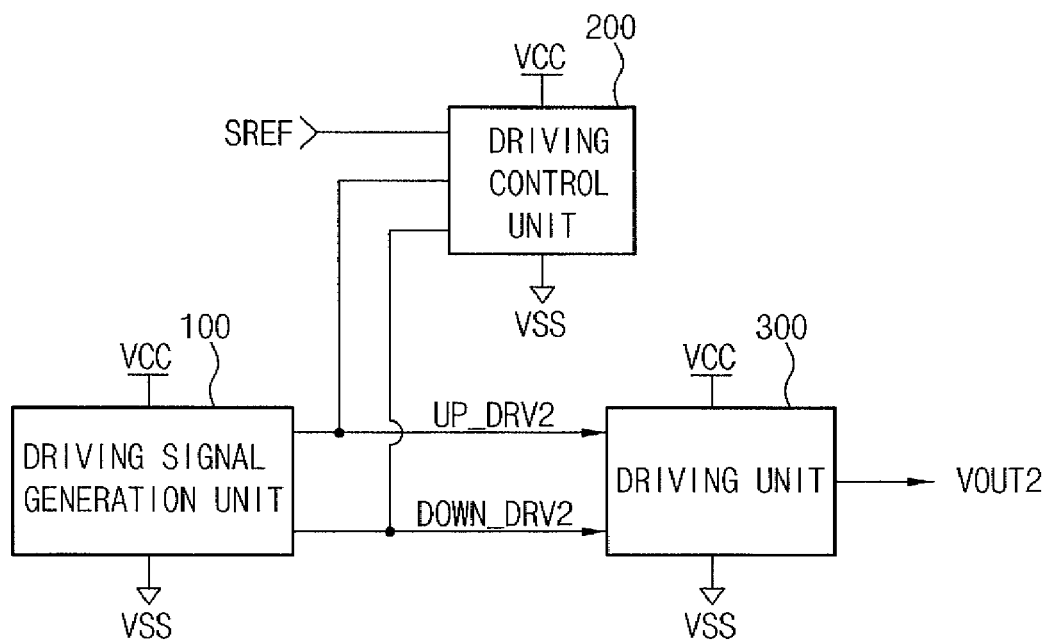
FIG. 2 is a block diagram illustrating the construction of an internal voltage generation circuit of a semiconductor memory device according to a first embodiment of the present invention.

To this end, as shown in FIG. 2, an internal voltage generation circuit 2 includes a driving signal generation unit 100, a driving control unit 200, and a driving unit 300. In FIG. 2, a power supply voltage VCC may be replaced by a core voltage, VCORE, or the like. An internal voltage VOUT2 is used as a bit line precharge voltage, a cell plate voltage, etc.

The driving signal generation unit 100 determines an internal reference voltage REF, not shown in FIG. 2, by dividing a voltage formed between the power supply voltage VCC and a ground voltage VSS, and generates two separate driving signals, UP_DRV2 and DOWN_DRV2.

The driving control unit 200 controls the voltage levels of the driving signals UP_DRV2 and DOWN_DRV2 by selectively supplying the power supply voltage VCC and ground voltage VSS by means of a self-refresh signal SREF, which is enabled in a self-refresh operation.

Herein, the self-refresh signal SREF, represents a mode signal that is input to the driving control unit 200 in order to increase the dead zone of the internal voltage VOUT2, in a self-refresh operation, and may be replaced by a different control signal to control the dead zone.

The driving unit 300 outputs an internal voltage VOUT2, for an internal use by a semiconductor device, having a voltage level between the power supply voltage VCC and the ground voltage VSS by selectively supplying the power supply voltage VCC and the ground voltage VSS based on the driving signals UP_DRV2 and DOWN_DRV2.

Herein, the driving unit 300 may include a pull-up MOS transistor (not shown) that receives the driving signal UP_DRV2 through the gate of the pull-up MOS transistor, and a pull-down MOS transistor (not shown) that receives the driving signal DOWN_DRV2 through the gate of the pull-down MOS transistor.

The internal voltage generation circuit 2 having the aforementioned construction according to the present invention can control the dead zone of the internal voltage VOUT2 by controlling the voltage levels of the driving signals UP_DRV2 and DOWN_DRV2 in a specific memory operation, such as a self-refresh operation.

For example, the internal voltage generation circuit 2 controls the internal voltage VOUT2 to have a narrow dead zone in a normal operation in which a read or write operation is repeatedly performed, and controls the internal voltage VOUT2 to have a wide dead zone in a self-refresh operation.

That is, according to the present invention, in a normal operation, the internal voltage generation circuit 2 may generate an internal voltage VOUT2 having the same dead zone as that in the prior art by turning off the driving control unit 200. Also, in normal operation, the internal voltage generation circuit may control each turn-on time of the pull-up and pull-down devices included in the driving unit 300 by controlling the voltage levels of the driving signals UP_DRV2 and DOWN_DRV2, so as to generate an internal voltage VOUT2 having a narrow dead zone.

In contrast, in a self-refresh operation, the internal voltage generation circuit 2 may generate an internal voltage VOUT2 having a wider dead zone than that in the normal operation by controlling the voltage levels of the driving signals UP_DRV2 and DOWN_DRV2 so as to supply a smaller current than that in the normal operation to the gates of the MOS transistors included in the driving unit 300.

The internal voltage generation circuit 2 of FIG. 2 according to a first embodiment of the present invention may be realized with various circuits.

Figure 3:
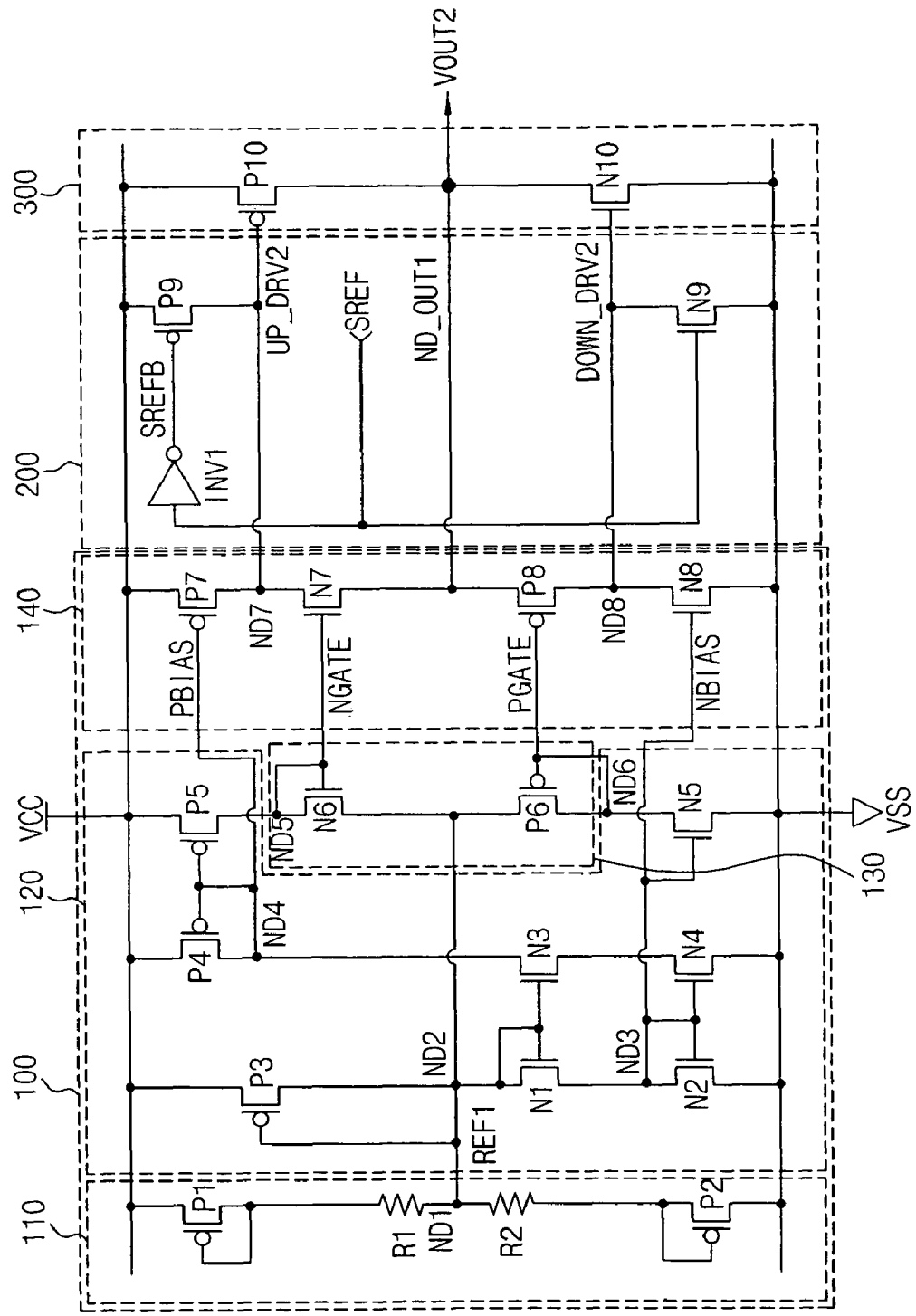
FIG. 3 is a detailed circuit diagram illustrating the construction of the internal voltage generation circuit shown in FIG. 2.

An example of the internal voltage generation circuit 2 of FIG. 2 is shown in the circuit 3 of FIG. 3, which is a full driving circuit in which the dead zone of an internal voltage is controlled according to the operation of the memory device.

In FIG. 3, the driving signal generation unit 100 includes a voltage divider 110, a bias voltage generator 120, a gate voltage generator 130 and an output unit 140. The voltage divider 110 generates a reference voltage REF1 having a target level determined by the designer by dividing a voltage, which is formed between the power supply voltage VCC and ground voltage VSS, by a predetermined resistance ratio, R1/R2. The bias voltage generator 120 generates a bias voltage PBIAS, which causes a constant current to flow from a node having the voltage level of the power supply voltage VCC, and a bias voltage NBIAS, which causes a constant current to flow from a node having the voltage level of the ground voltage VSS using the reference voltage REF1. The gate voltage generator 130 generates a gate voltage NGATE having a higher voltage level than the reference voltage REF1 and a gate voltage PGATE having a lower voltage level than the reference voltage REF1, by means of the reference voltage REF1. The output unit 140 generates first and second output voltages identified as driving signals UP_DRV2 and DOWN_DRV2, which are determined by the bias voltages PBIAS and NBIAS and the gate voltages NGATE and PGATE.

The driving control unit 200 controls each electric potential of the driving signals UP_DRV2 and DOWN_DRV2 by selectively supplying the power supply voltage VCC and ground voltage VSS based on a self-refresh control signal SREF, which is enabled in a self-refresh operation.

The driving unit 300 outputs an internal voltage VOUT2, having a voltage level between the power supply voltage VCC and ground voltage VSS, by selectively supplying the power supply voltage VCC and ground voltage VSS based on the driving signals UP_DRV2 and DOWN_DRV2.

The structure and operation of the internal voltage generation circuit having the aforementioned construction will now be described in greater detail with continued reference to FIG. 3.

First, the voltage divider 110 may include a PMOS transistor diode P1, a resistor R1, a resistor R2 and a PMOS transistor diode P2 which are serially connected between the power supply voltage VCC and ground voltage VSS.

The voltage divider 110 having such a construction outputs the reference voltage REF1 through node ND1, which node is located between the resistors R1 and R2.

The bias voltage generator 120 may include a PMOS transistor P3 connected between node ND2 and the power supply voltage VCC, an NMOS transistor N1 connected between node ND2 and node ND3, an NMOS transistor N2 connected between node ND3 and the ground voltage VSS, a PMOS transistor P4 connected between node ND4 and the line of the power supply voltage VCC, an NMOS transistor N3 connected between node ND4 and an NMOS transistor N4, the NMOS transistor N4 connected between the NMOS transistor N3 and the line of the ground voltage VSS, a PMOS transistor P5 connected between node ND5 and the line of the power supply voltage VCC, and an NMOS transistor N5 connected between node ND6 and the line of the ground voltage VSS.

Herein, the reference voltage REF1 is input to the gate of the PMOS transistor P3, and the gates of the NMOS transistors N1 and N3 are connected to the node ND2. In addition, the gates of the NMOS transistors N2, N4 and N5 are connected to the node ND3. The gates of the PMOS transistors P4 and P5 are connected to the node ND4.

The bias voltage generator 120 having such a construction provides current to the nodes ND2, ND3, ND4 and ND 6 through a plurality of the NMOS transistors N1 to N5 having a current mirror structure. Also, the bias voltage generator 120 provides the same current to the nodes ND4 and ND5 through the PMOS transistors P4 and P5 having a current mirror structure.

Accordingly, the bias voltage generator 120 outputs bias voltages NBIAS and PBIAS through nodes ND3 and ND4, respectively, by means of a plurality of the NMOS transistors N1 to N5 and PMOS transistors P4 and P5, which have a current mirror structure.

The gate voltage generator 130 may include an NMOS transistor N6 connected between the nodes ND5 and ND2, and a PMOS transistor P6 connected between the nodes ND2 and ND6. The gate of the NMOS transistor N6 is connected to the node ND5, and the gate of the PMOS transistor P6 is connected to the node ND 6.

The gate voltage generator 130 having such a construction outputs a gate voltage NGATE having a voltage level higher than the reference voltage REF1 by the threshold voltage of the NMOS transistor N6, and a gate voltage PGATE having a voltage level lower than the reference voltage REF1 by the threshold voltage of the PMOS transistor P6, by means of the reference voltage REF1.

The output unit 140 may include a PMOS transistor P7 connected between node ND7 and the power supply voltage VCC, an NMOS transistor N7 connected between the node ND7 and an output node ND_OUT1, a PMOS transistor P8 connected between the output node ND_OUT1 and node ND8, and a NMOS transistor N8 connected between the node ND8 and the node of the ground voltage VSS.

Herein, the bias voltage PBIAS is input to the gate of the PMOS transistor P7, and the gate voltage NGATE is input to the gate of the NMOS transistor N7. Also, the gate voltage PGATE is input to the gate of the PMOS transistor P8, and the gate voltage NGATE is input to the gate of the NMOS transistor N8.

The output unit 140 having such a construction outputs the driving signal UP_DRV2 to the node ND7 through the PMOS transistor P7 and NMOS transistor N7, and simultaneously outputs the driving signal DOWN_DRV2 to the node ND8 through the PMOS transistor P8 and NMOS transistor N8.

That is, the output unit 140 receives the bias voltages PBIAS and NBIAS and the gate voltages NGATE and PGATE, and outputs the driving signal UP_DRV2 and the driving signal DOWN_DRV2 to control a PMOS transistor P10 and an NMOS transistor N10, respectively.

The driving control unit 200 may include an inverter INV1 for receiving a self-refresh signal SREF, a PMOS transistor P9 connected between the power supply voltage VCC and the node ND7, and an NMOS transistor N9 connected between the node ND8 and the ground voltage VSS.

Herein, an inverted self-refresh signal SREFB is input to the gate of the PMOS transistor P9 by the inverter INV1. The self-refresh signal SREF is also input to the gate of the NMOS transistor N9.

The driving control unit 200 having such a construction turns on the PMOS transistor P9 by means of the inverted self-refresh signal SREFB in the self-refresh operation of a semiconductor memory device, thereby increasing the voltage of the driving signal UP_DRV2.

In addition, in the self-refresh operation of the semiconductor memory device, the driving control unit 200 turns off the NMOS transistor N9 by means of the self-refresh signal SREF, thereby decreasing the voltage of the driving signal DOWN_DRV2.

The driving unit 300 may include the PMOS transistor P10 connected between the power supply voltage VCC and the output node ND_OUT1, and the NMOS transistor N10 connected between the output node ND_OUT1 and the node of the ground voltage VSS.

Herein, the driving signal UP_DRV2 is input to the gate of the PMOS transistor P10 through the node ND7, and the driving signal DOWN_DRV2 is input to the gate of the NMOS transistor N10 through the node ND8. When the internal voltage VOUT2 is lower than the reference voltage REF1, the driving unit 300 having the aforementioned construction increases the voltage of the output node ND_OUT1 by turning on the PMOS transistor P10 until the internal voltage VOUT2 reaches the reference voltage REF1.

Also, when the internal voltage VOUT2 is higher than the reference voltage REF1, the driving unit 300 decreases the voltage of the output node ND_OUT1 by turning on the NMOS transistor N10 until the internal voltage VOUT2 reaches the reference voltage REF1.

As described above, in a self-refresh operation, the internal voltage generation circuit 3 of FIG. 3 increases the voltage of the driving signal UP_DRV2 and simultaneously decreases the voltage of the driving signal DOWN_DRV2 by means of the driving control unit 200. That is, in the self-refresh operation, the internal voltage generation circuit of FIG. 3 delays each turn-on time of the PMOS transistor P10 and NMOS transistor N10 based on a change in the voltage level of the power supply voltage VCC.

Therefore, the internal voltage generation circuit according to the present invention increases the dead zone through the driving control unit 200 in the self-refresh operation, so that it is possible to reduce the current consumption of the PMOS transistor P10 and NMOS transistor N10 based on a change in the voltage level of the power supply voltage VCC.

Figure 4:
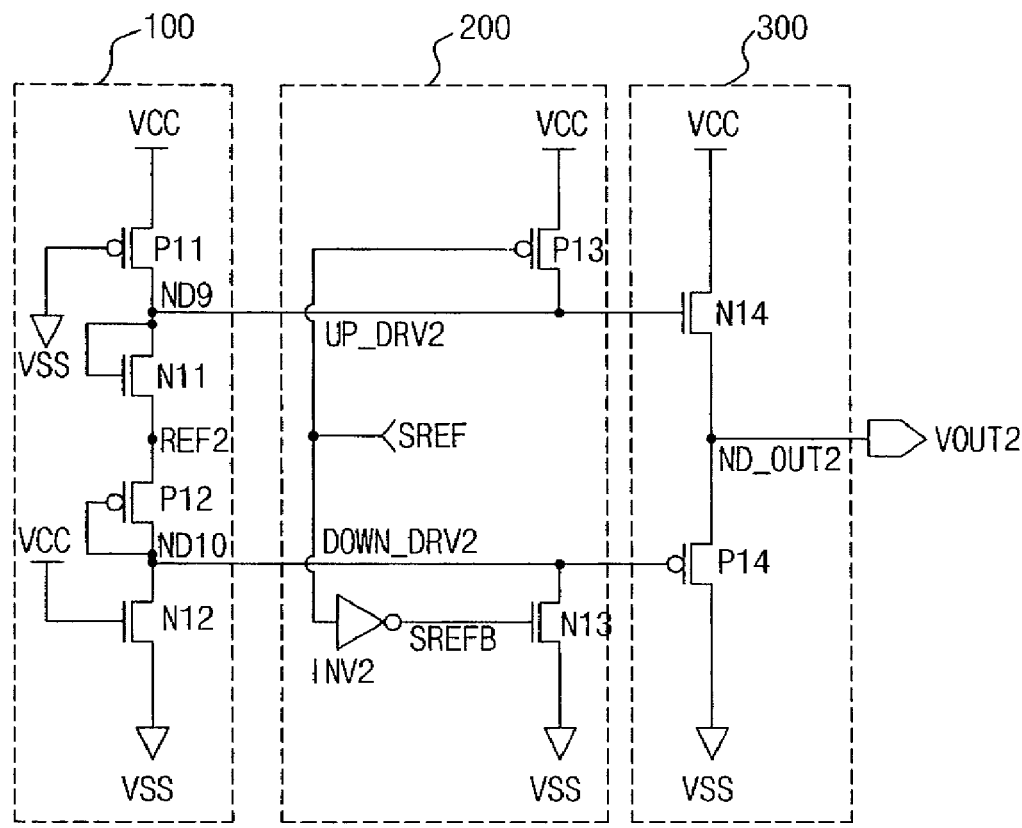
FIG. 4 is another detailed circuit diagram illustrating the construction of the internal voltage generation circuit shown in FIG. 2.

FIG. 4 illustrates another example of an internal voltage generation circuit according to the present invention, wherein the dead zone of an internal voltage is controlled according to the operation of a memory device in a source follower structure. In FIG. 4, a driving signal generation unit 100 generates a reference voltage REF2 having a target level determined by the designer by dividing a voltage between a power supply voltage VCC and a ground voltage VSS, by a predetermined resistance ratio. In addition, the driving signal generation unit 100 outputs driving signals UP_DRV2 and DOWN_DRV2, which have different voltage levels depending on a change in the voltage level of the power supply voltage VCC.

A driving control unit 200 increases the voltage level of the driving signal UP_DRV2 and decreases the voltage level of the driving signal DOWN_DRV2, by a self-refresh signal SREF, which is enabled in a self-refresh operation.

A driving unit 300 outputs an internal voltage VOUT2 having a voltage level between the power supply voltage VCC and ground voltage VSS by selectively supplying the power supply voltage VCC and ground voltage VSS based on the driving signals UP_DRV2 and DOWN_DRV2.

The structure and operation of the internal voltage generation circuit having such a construction as shown in FIG. 4 will now be described in detail.

First, the driving signal generation unit 100 may include a PMOS transistor P11, an NMOS transistor diode N11, a PMOS transistor diode P12 and an NMOS transistor N12, which are serially connected between the power supply voltage VCC and ground voltage VSS. The gate of the PMOS transistor P11 is biased to the ground voltage VSS, and the gate of the NMOS transistor N12 is biased to the power supply voltage VCC.

The driving signal generation unit 100 having such a construction generates the reference voltage REF2 at a node between the NMOS transistor diode N11 and PMOS transistor diode P12. It also simultaneously outputs the driving signals UP_DRV2 and DOWN_DRV2 through nodes ND9 and ND10, respectively.

The driving control unit 200 may include a PMOS transistor P13, which is turned on or off based on the self-refresh signal SREF, an inverter INV2 for inverting the self-refresh signal SREF, and an NMOS transistor N13, which is turned on or off based on an inverted self-refresh signal SREFB.

Herein, the PMOS transistor P13 provides the power supply voltage VCC to the node ND9 by the self-refresh signal SREF. In addition, the NMOS transistor N13 provides the ground voltage VSS to the node ND10 by the self-refresh signal SREF.

According to the driving control unit 200 having such a construction, in a self-refresh operation, the PMOS transistor P13 is turned off by the self-refresh signal SREF, thereby interrupting the supply of the power supply voltage VCC to the node ND9.

In addition, in the self-refresh operation, the NMOS transistor N13 in the driving control unit 200 is turned off by the inverted self-refresh signal SREFB, thereby interrupting the supply of the ground voltage VSS to the node ND10.

In contrast, in an operation other than the self-refresh operation, the PMOS transistor P13 and NMOS transistor N13 in the driving control unit 200 are both turned on. Accordingly, the voltage level of the driving signal UP_DRV2 is increased by the power supply voltage VCC, and the voltage level of the driving signal DOWN_DRV2 is decreased by the ground voltage VSS.

Therefore, when the PMOS transistor P13 and NMOS transistor N13 are turned on by the self-refresh signal SREF, the driving signal UP_DRV2 has a lower voltage level than that in an operation other than the self-refresh operation. In contrast, the driving signal DOWN_DRV2 has a higher voltage level in a self-refresh operation than that in an operation other than the self-refresh operation.

The driving unit 300 may include an NMOS transistor N14 and a PMOS transistor P14, which are serially connected between the power supply voltage VCC and ground voltage VSS, in which the internal voltage VOUT2 is outputted through an output node ND_OUT2 between the NMOS transistor N14 and PMOS transistor P14.

Herein, the driving signal UP_DRV2 determined whether the NMOS transistor N14 is turned on or off. The driving signal DOWN_DRV2 determines whether the PMOS transistor P14 is turned on or off.

As described above, when the internal voltage VOUT2 is lower than the reference voltage REF2, the driving unit 300 increases the voltage of the output node ND_OUT2 by turning on the NMOS transistor N14 until the internal voltage VOUT2 reaches the reference voltage REF2. When the internal voltage VOUT2 is higher than the reference voltage REF2, the driving unit 300 decreases the voltage of the output node ND_OUT2 by turning on the PMOS transistor P14 until the internal voltage VOUT2 reaches the reference voltage REF2.

As described above, in an operation other than the self-refresh operation, the internal voltage generation circuit 4 of FIG. 4 increases the voltage level of the driving signal UP_DRV2 and simultaneously decreases the voltage level of the driving signal DOWN_DRV2, through the driving control unit 200.

When the memory device performs an operation other than a self-refresh operation, an internal voltage VOUT2 having a wider dead zone is generated than when the memory device performs the self-refresh operation. It is therefore possible to reduce current consumption due to a change in the voltage level of the power supply voltage VCC.

Figure 5:
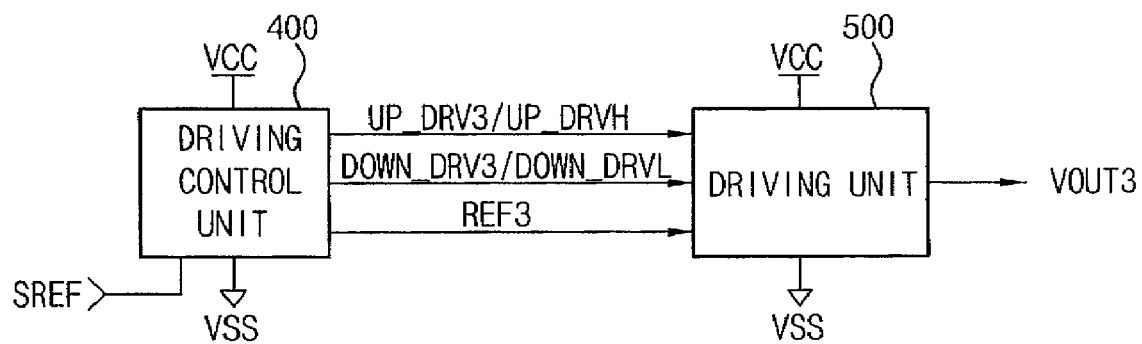
FIG. 5 is a circuit diagram illustrating the construction of an internal voltage generation circuit of a semiconductor memory device according to a second embodiment of the present invention.

FIG. 5 is a block diagram illustrating the construction of yet another internal voltage generation circuit 5 according to another embodiment of the present invention. The internal voltage generation circuit 5 of FIG. 5 generates a reference voltage, REF3, which is a target level of an internal voltage. Then, the internal voltage generation circuit selects one of driving signals, which form dead zones different from each other, according to the operation of a memory device, and then generates and maintains the internal voltage by applying the selected driving signal.

In detail, the internal voltage generation circuit 5 according to the embodiment shown in FIG. 5 includes a driving control unit 400 and driving unit 500. A power supply voltage VCC may be replaced by a core voltage VCORE or the like, and an internal voltage VOUT3 may be used as a bit line precharge voltage or a cell plate voltage, etc.

The driving control unit 400 establishes a reference voltage REF3 and generates a plurality of driving signals UP_DRV3, DOWN_DRV3, UP_DRVH and DOWN_DRVL, by dividing a voltage formed between the power supply voltage VCC and a ground voltage VSS. Then, the driving control unit 400 selects either one pair of driving signals UP_DRV3 and DOWN_DRV3 or one pair of driving signals UP_DRVH and DOWN_DRVL, according to a self-refresh signal SREF.

Herein, the self-refresh signal SREF is input to increase the dead zone of the internal voltage VOUT3 in a self-refresh operation, and may be replaced by a different signal to control the dead zone of the internal voltage VOUT3.

The driving unit 500 generates the internal voltage VOUT3 having a constant dead zone on the basis of the reference voltage REF3 by one pair of driving signals selected by the driving control unit 400.

According to the internal voltage generation circuit having such a construction based on the present invention, in a specific operation such as a self-refresh operation in a memory device, the dead zone of the internal voltage VOUT3 is determined by either one pair of driving signals UP_DRV3 and DOWN_DRV3 or one pair of driving signals UP_DRVH and DOWN_DRVL.

For example, in the internal voltage generation circuit of FIG. 5, an internal voltage VOUT3 having a narrow dead zone is generated when a normal operation of repeatedly performing a read or write operation is carried out, while an internal voltage VOUT3 having a wide dead zone is generated when a self-refresh operation is performed.

That is, according to the internal voltage generation circuit of FIG. 5, in a normal operation, the driving control unit 400 selects the driving signals UP_DRV3 and DOWN_DRV3, and generates an internal voltage VOUT3 having the same dead zone as that in the prior art.

In contrast, in a self-refresh operation, the driving control unit 400 selects the driving signals UP_DRVH and DOWN_DRVL, and generates an internal voltage VOUT3 having a wider dead zone than that in a normal operation.

The internal voltage generation circuit 5 according to the embodiment shown in FIG. 5 may be realized by means of various circuits, which will now be described in detail.

Circuit diagrams of the driving control unit 400 are illustrated in FIGS. 6A to 6G. Each driving control unit shown in FIGS. 6A to 6G includes a voltage divider 410 and a selection unit 420. For reference, reference sign "N ea" in FIGS. 6A to 6G represents that a plurality of equal elements have been omitted.

Figure 6A:
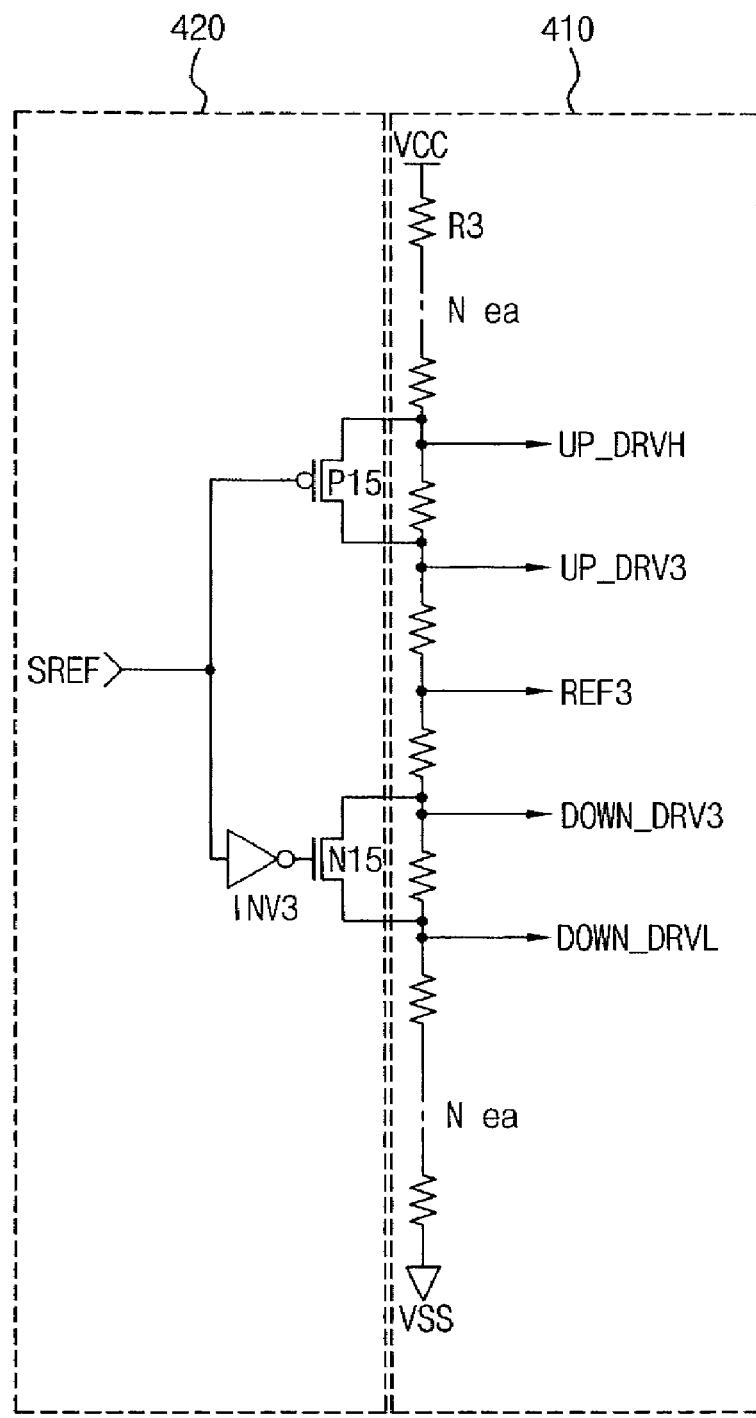
FIGS. 6A to 6G are detailed circuit diagrams illustrating the construction of the driving control unit shown in FIG. 5.

In FIG. 6A, the voltage divider 410 may include a plurality of resistors R3 serially connected between a power supply voltage VCC and a ground voltage VSS, so as to output a reference voltage REF3 and a plurality of driving signals UP_DRV3, DOWN_DRV3, UP_DRVH and DOWN_DRVL.

Figure 6B:
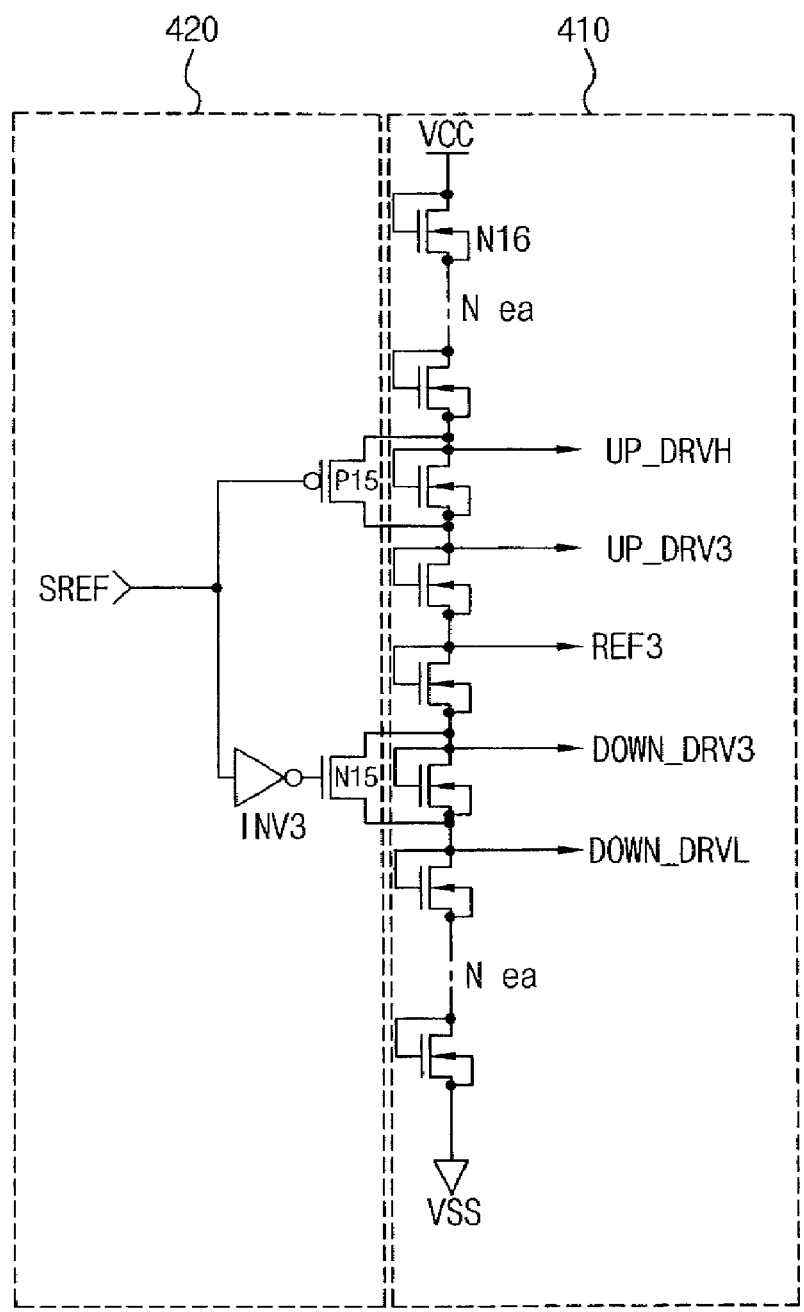

In FIG. 6B, the voltage divider 410 may include a plurality of NMOS transistor diodes N16 serially connected between a power supply voltage VCC and a ground voltage VSS, so as to output a reference voltage REF3 and a plurality of driving signals UP_DRV3, DOWN_DRV3, UP_DRVH and DOWN_DRVL.

Figure 6C:
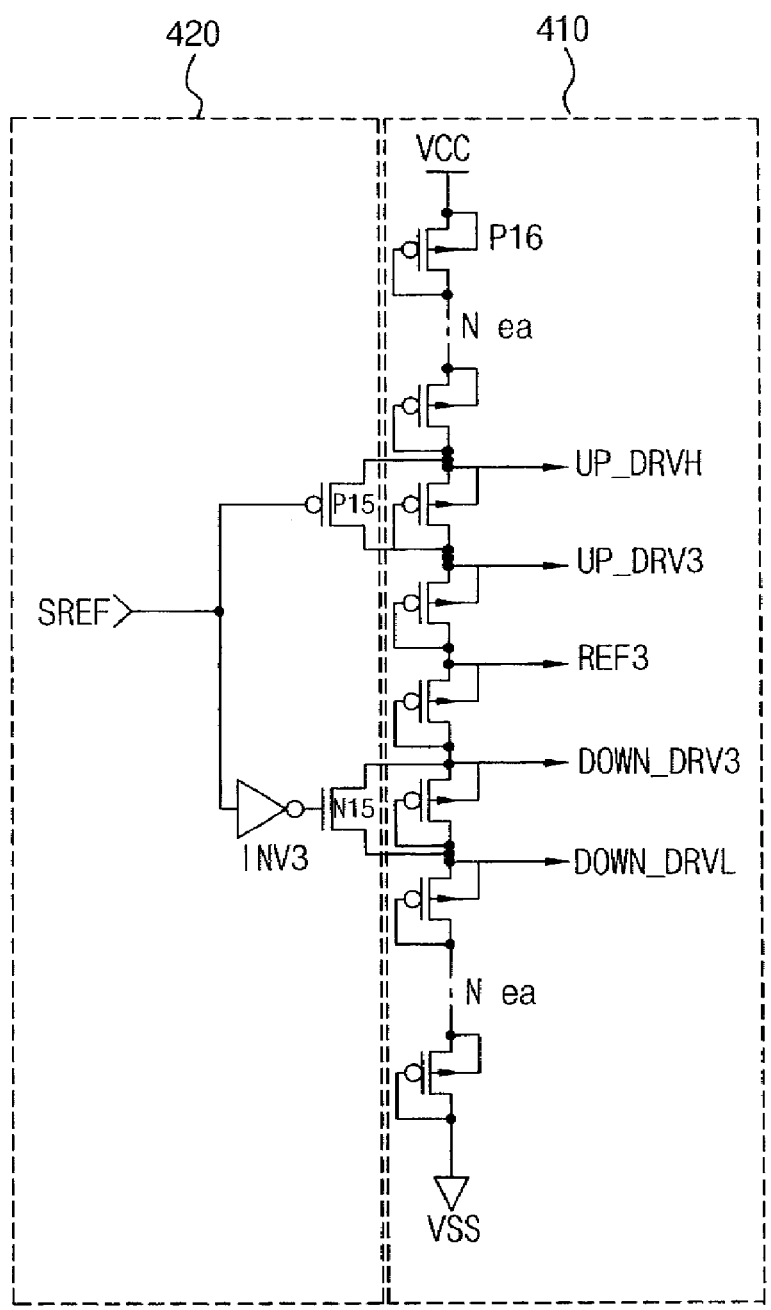

In FIG. 6C, the voltage divider 410 may include a plurality of PMOS transistor diodes P16 serially connected between a power supply voltage VCC and a ground voltage VSS, so as to output a reference voltage REF3 and a plurality of driving signals UP_DRV3, DOWN_DRV3, UP_DRVH and DOWN_DRVL.

Figure 6D:
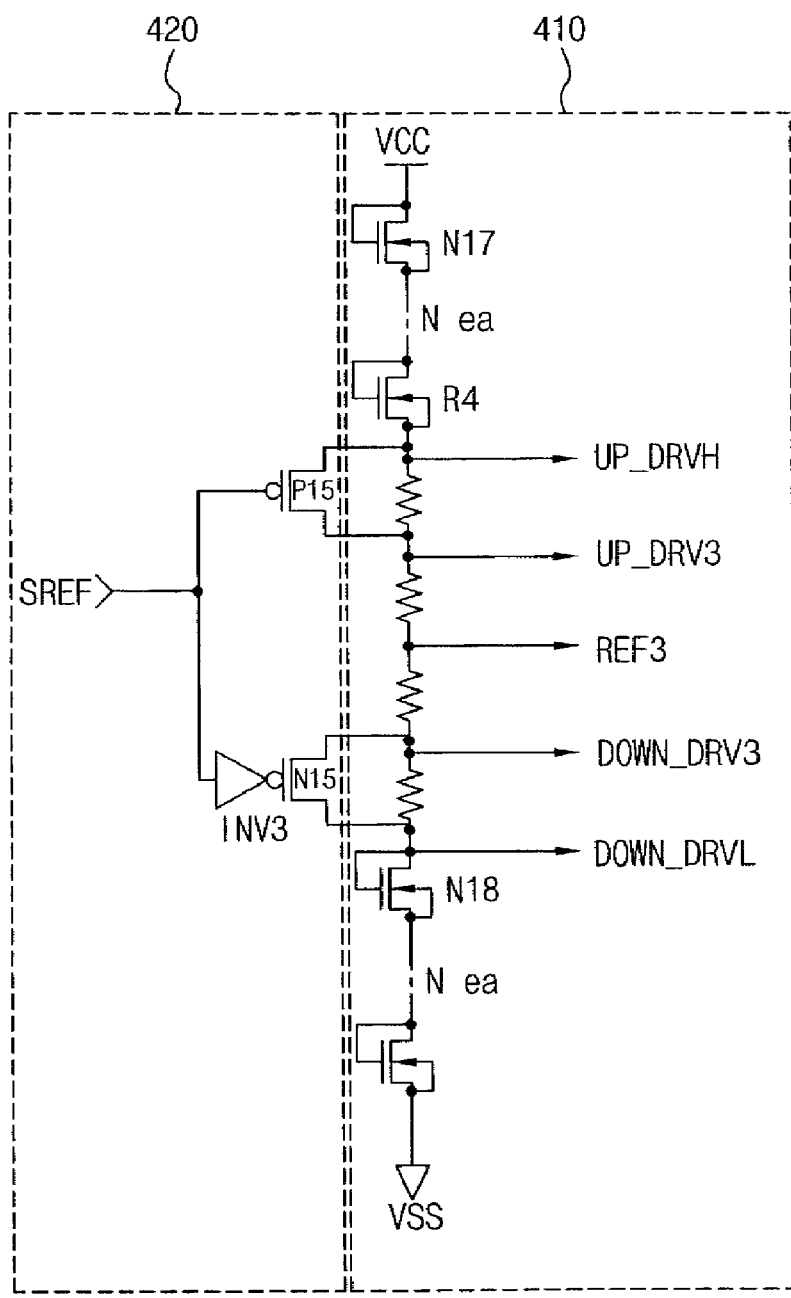

In FIG. 6D, the voltage divider 410 may include a plurality of NMOS transistor diodes N17, a plurality of resistors R4 and a plurality of NMOS transistor diodes N18, which are serially connected between a power supply voltage VCC and a ground voltage VSS, so as to output a reference voltage REF3 and a plurality of driving signals UP_DRV3, DOWN_DRV3, UP_DRVH and DOWN_DRVL.

Figure 6E:
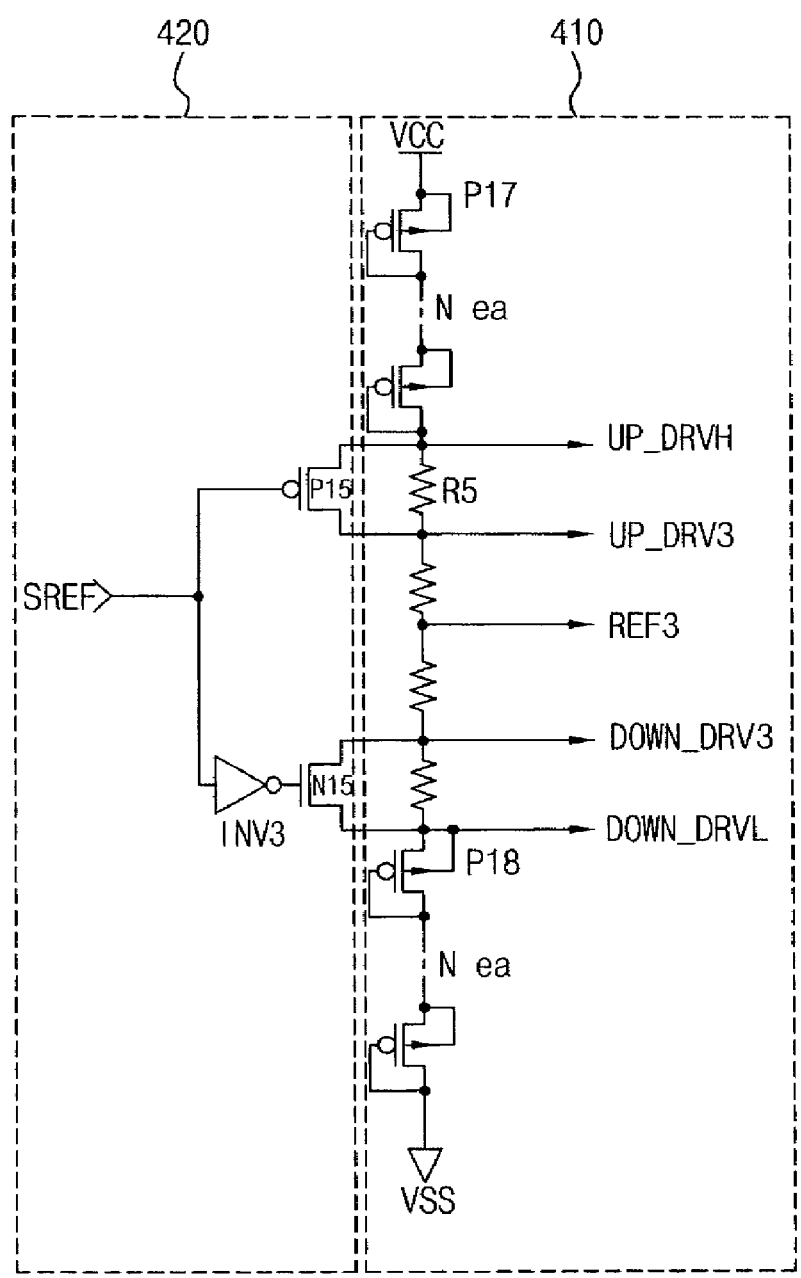

In FIG. 6E, the voltage divider 410 may include a plurality of PMOS transistor diodes P17, a plurality of resistors R5 and a plurality of PMOS transistor diodes P18, which are serially connected between a power supply voltage VCC and a ground voltage VSS, so as to output a reference voltage REF3 and a plurality of driving signals UP_DRV3, DOWN_DRV3, UP_DRVH and DOWN_DRVL.

Figure 6F:
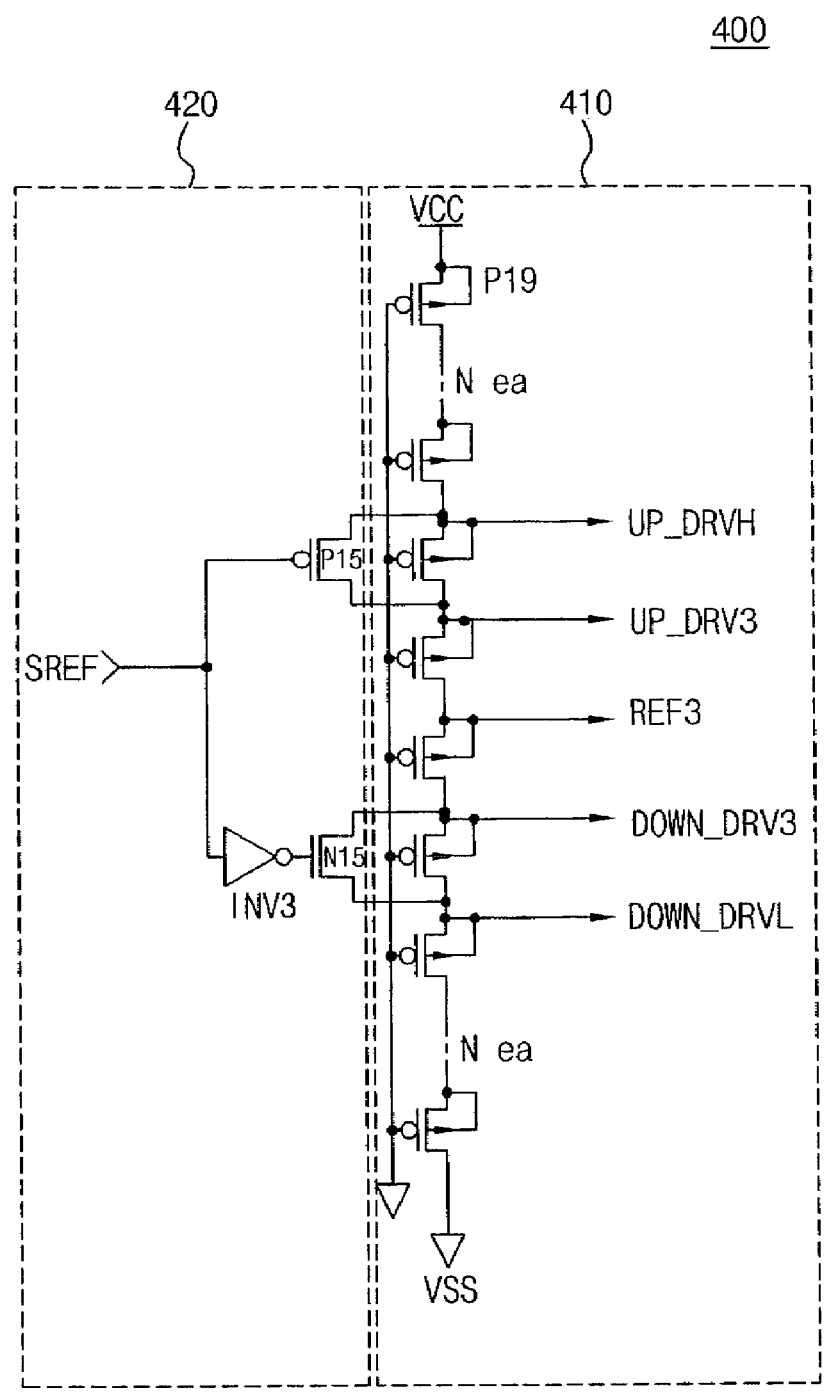

In FIG. 6F, the voltage divider 410 may include a plurality of PMOS transistors P19 serially connected between a power supply voltage VCC and a ground voltage VSS, so as to output a reference voltage REF3 and a plurality of driving signals UP_DRV3, DOWN_DRV3, UP_DRVH and DOWN_DRVL. Herein, the gate of each PMOS transistor P19 is connected to the ground voltage VSS.

Figure 6G:
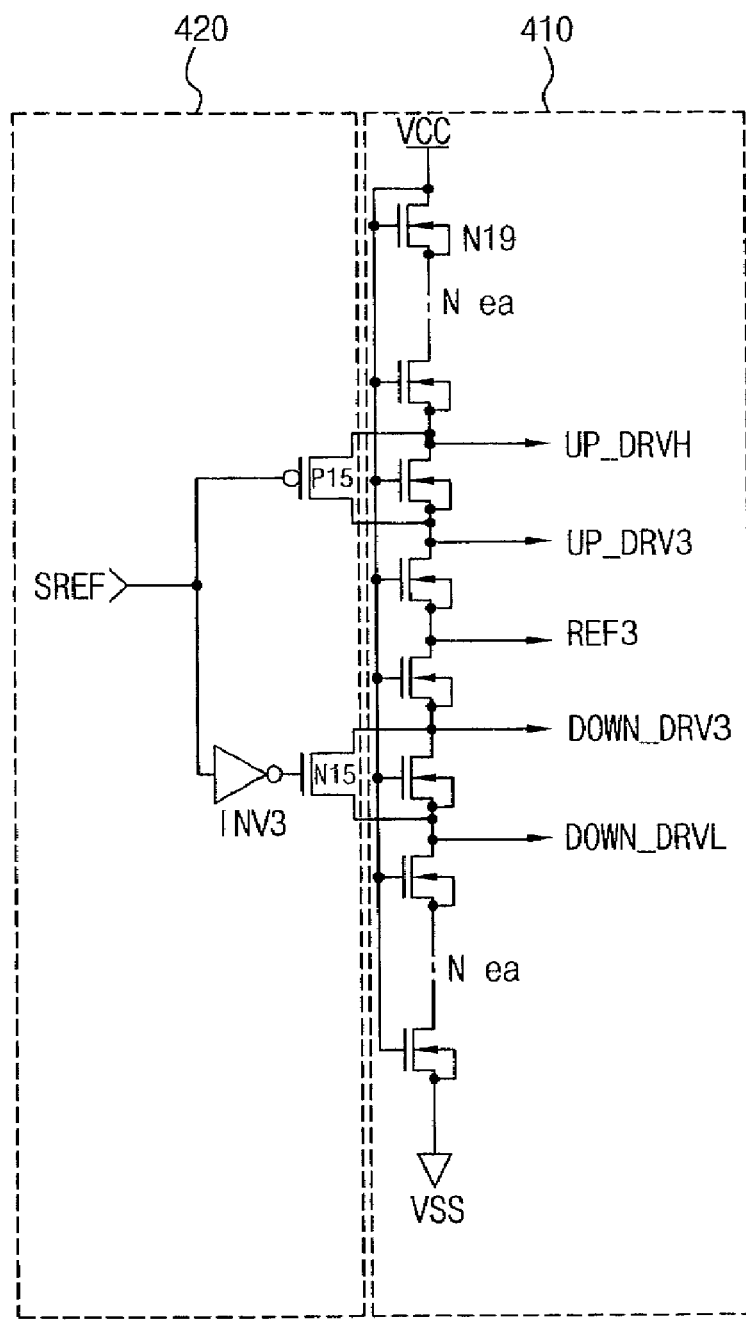

In FIG. 6G, the voltage divider 410 may include a plurality of NMOS transistors N19 serially connected between a power supply voltage VCC and a ground voltage VSS, so as to output a reference voltage REF3 and a plurality of driving signals UP_DRV3, DOWN_DRV3, UP_DRVH and DOWN_DRVL. Herein, the power supply voltage VCC is input to the gate of each NMOS transistor N19.

The voltage dividers 410 described above output a reference voltage REF3 and a plurality of driving signals UP_DRV3, DOWN_DRV3, UP_DRVH and DOWN_DRVL, by means of a plurality of resistors, by means of a plurality of transistor diodes, or by means of combinations thereof. The generated reference voltage REF3 and driving signals UP_DRV3, DOWN_DRV3, UP_DRVH and DOWN_DRVL are input to the driving unit 500, which will be described later.

Herein, the reference voltage REF3 has a value of a middle level between the power supply voltage VCC and the ground voltage VSS.

Also, the driving signals UP_DRV3 and UP_DRVH have higher voltage levels than that of the reference voltage REF3. The driving signals UP_DRV3 and UP_DRVH are used to decrease the level of an internal voltage VOUT3 when the internal voltage VOUT3 outputted from the driving unit 500 has a higher voltage level than those of the driving signals UP_DRV3 and UP_DRVH, respectively.

Also, the driving signals DOWN_DRV3 and DOWN_DRVL have lower voltage levels than that of the reference voltage REF3. The driving signals DOWN_DRV3 and DOWN_DRVL are used to increase the level of an internal voltage VOUT3 when the internal voltage VOUT3 outputted from the driving unit 500 has a lower voltage level than those of the driving signals DOWN_DRV3 and DOWN_DRVL, respectively.

As shown in FIGS. 6A to 6G, the selection unit 420 may include a PMOS transistor P15 connected between a node for outputting the driving signal UP_DRVH and a node for outputting the driving signal UP_DRV3, an inverter INV3 for receiving a self-refresh signal SREF, and an NMOS transistor N15 connected between a node for outputting the driving signal DOWN_DRV3 and a node for outputting the driving signal DOWN_DRVL.

Herein, the self-refresh signal SREF is input to the gate of the PMOS transistor P15, and an inverted self-refresh signal SREFB is input to the gate of the NMOS transistor N15 through the inverter INV3.

The selection unit 420 having such a construction selects the driving signals UP_DRV3 and DOWN_DRV3 when the memory device performs an operation other than a self-refresh operation. In contrast, when the memory device performs the self-refresh operation, the selection unit 420 selects the driving signal UP_DRVH having a higher level than that of the driving signal UP_DRV3, and the driving signal DOWN_DRVL having a lower level than that of the driving signal DOWN_DRV3.

Figure 7A:
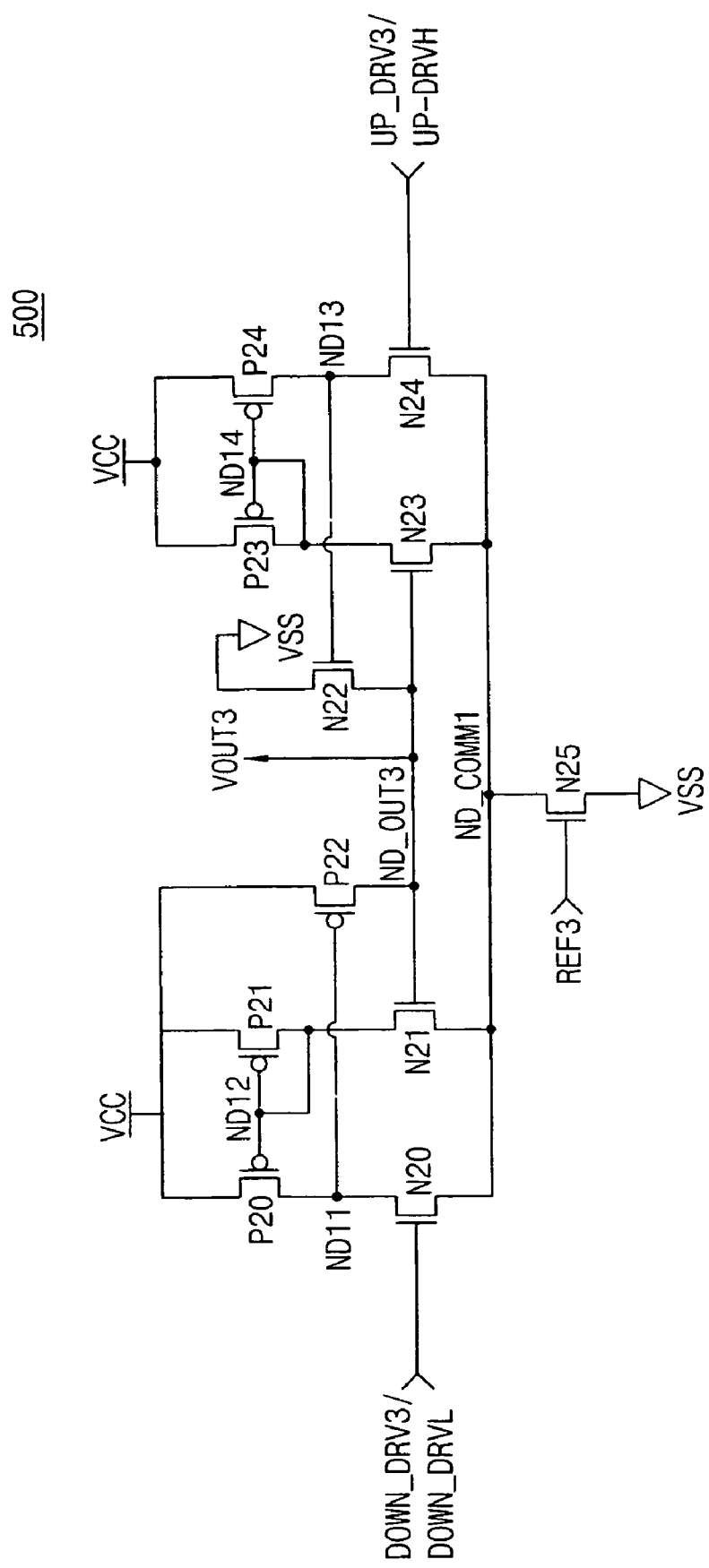
FIGS. 7A and 7B are detailed circuit diagrams illustrating the construction of the driving unit shown in FIG. 5.
Figure 7B:
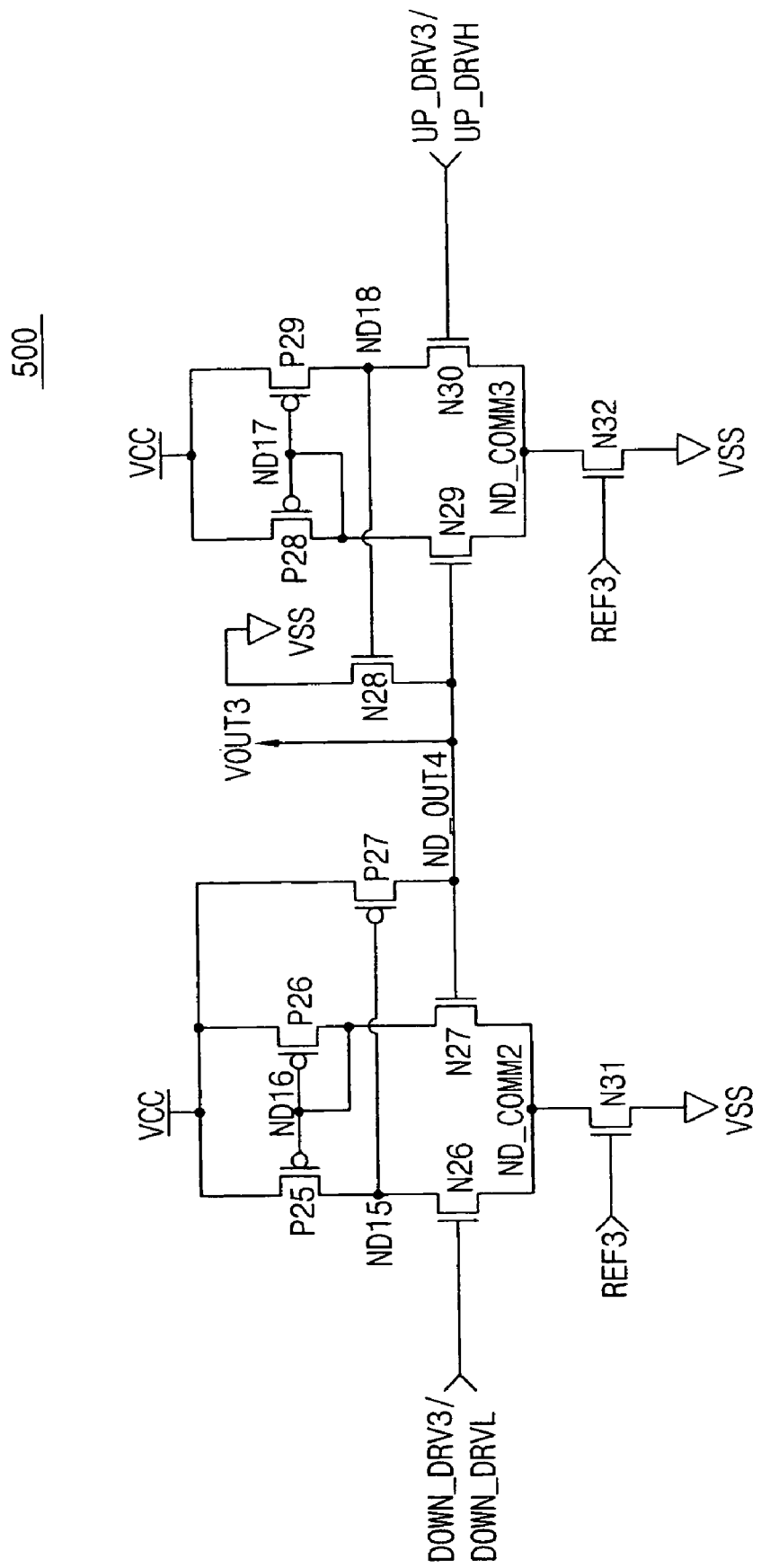

Meanwhile, FIGS. 7A and 7B are detailed circuit diagrams illustrating the construction of the driving unit 500 which outputs an internal voltage VOUT3 by means of the output signal of the driving control unit 400, and will now be described in detail.

Herein, a power supply voltage VCC may be replaced by a core voltage VCORE or the like, and an internal voltage VOUT3 may be used as a bit line precharge voltage or a cell plate voltage, etc.

As shown in FIG. 7A, the driving unit 500 may include a PMOS transistor P20 connected between the power supply voltage VCC and node ND11, an NMOS transistor N20 connected between the node ND11 and a common node ND_COMM1, a PMOS transistor P21 connected between the power supply voltage VCC and node ND12, an NMOS transistor N21 connected between the node ND12 and common node ND_COMM1, a PMOS transistor P22 connected between the power supply voltage VCC and an output node ND_OUT3, an NMOS transistor N22 connected between the output node ND_OUT3 and the ground voltage VSS, a PMOS transistor P23 connected between the power supply voltage VCC and node ND14, an NMOS transistor N23 connected between the node ND14 and common node ND_COMM1, a PMOS transistor P24 connected between the power supply voltage VCC and node ND13, an NMOS transistor N24 connected between the node ND13 and common node ND_COMM1, and an NMOS transistor N25 connected between the common node ND_COMM1 and the ground voltage VSS.

Herein, the gates of the PMOS transistors P20 and P21 are both respectively connected to the node ND12, and the gate of the PMOS transistor P22 is connected to the node ND11.

The driving signal DOWN_DRVL is input to the gate of the NMOS transistor N20 in a self-refresh operation, and the driving signal DOWN_DRV3 is input to the gate of the NMOS transistor N20 in an operation other than the self-refresh operation. The gates of the NMOS transistors N21 and N23 are both connected to the output node ND_OUT3 respectively.

In addition, the gate of the NMOS transistor N22 is connected to the node ND13, and the gates of the PMOS transistors P23 and P24 are connected to the node ND14.

The driving signal UP_DRVH is input to the gate of the NMOS transistor N24 in the self-refresh operation, and the driving signal UP_DRV3 is input to the gate of the NMOS transistor N24 in an operation other than the self-refresh operation. The reference voltage REF3 is input to the gate of the NMOS transistor N25.

In FIG. 7B, the driving unit 500 may include a PMOS transistor P25 connected between the node of the power supply voltage VCC and node ND15, an NMOS transistor N26 connected between the node ND15 and a common node ND_COMM2, a PMOS transistor P26 connected between the node of the power supply voltage VCC and node ND16, an NMOS transistor N27 connected between the node ND16 and common node ND_COMM2, a PMOS transistor P27 connected between the node of the power supply voltage VCC and an output node ND_OUT4, an NMOS transistor N28 connected between the output node ND_OUT4 and the node of the ground voltage VSS, a PMOS transistor P28 connected between the node of the power supply voltage VCC and node ND18, an NMOS transistor N29 connected between the node ND18 and a common node ND_COMM3, a PMOS transistor P29 connected between the node of the power supply voltage VCC and node ND17, an NMOS transistor N30 connected between the node ND17 and common node ND_COMM3, an NMOS transistor N31 connected between the common node ND_COMM3 and the node of the ground voltage VSS, and an NMOS transistor N32 connected between the common node ND_COMM3 and the node of the ground voltage VSS.

Herein, the gates of the PMOS transistors P25 and P26 are both respectively connected to the node ND16, and the gate of the PMOS transistor P27 is connected to the node ND15.

The driving signal DOWN_DRVL is input to the gate of the NMOS transistor N26 in a self-refresh operation, and the driving signal DOWN_DRV3 is input to the gate of the NMOS transistor N26 in an operation other than the self-refresh operation. The gates of the NMOS transistors N27 and N29 are both respectively connected to the output node ND_OUT4.

In addition, the gate of the NMOS transistor N28 is connected to the node ND17, and the gates of the PMOS transistors P28 and P29 are connected to the node ND18.

The driving signal UP_DRVH is input to the gate of the NMOS transistor N30 in the self-refresh operation, and the driving signal UP_DRV3 is input to the gate of the NMOS transistor N30 in an operation other than the self-refresh operation. The reference voltage REF3 is input to each gate of the NMOS transistors N31 and N32.

According to the driving unit 500 having such a construction, the internal voltage VOUT3 is compared with the driving signal DOWN_DRV3 or DOWN_DRVL. Then, when the internal voltage VOUT3 is lower than the driving signal DOWN_DRV3 or DOWN_DRVL, the voltage of the node ND11 or ND15 becomes a low level, thereby driving the PMOS transistor P22 or P27, respectively. Accordingly, the driving unit 500 transmits the power supply voltage VCC to the output node ND_OUT3 or ND_OUT4, thereby increasing the level of the internal voltage VOUT3.

In addition, the driving unit 500 compares the internal voltage VOUT3 with the driving signal UP_DRV3 or UP_DRVH. Then, when the internal voltage VOUT3 is higher than the driving signal UP_DRV3 or UP_DRVH, the voltage of the node ND13 or ND17 becomes a high level, thereby driving the NMOS transistor N22 or N28. Accordingly, the driving unit 500 transmits the ground voltage VSS to the output node ND_OUT3 or ND_OUT4, thereby decreasing the level of the internal voltage VOUT3.

As described above, according to the second embodiment of the present invention, in a self-refresh operation, the internal voltage generation circuit increases the dead zone of the internal voltage VOUT3 by means of a self-refresh signal SREF.

That is, in a self-refresh operation, the driving control unit 400 provides the driving signals DOWN_DRVL and UP_DRVH to the driving unit 500, thereby preventing the operation of the driving unit 500 when the power supply voltage VCC increases or decreases within a predetermined level range.

Therefore, the internal voltage generation circuit according to the second embodiment of the present invention can reduce unnecessary current consumption due to a change in the level of the power supply voltage VCC in a self-refresh operation.

Hereinafter, a comparison between a dead zone formed in a normal operation of repeatedly performing a read or write operation and a dead zone formed in a self-refresh mode in the internal voltage generation circuits according to the embodiments of the present invention will be described with reference to FIG. 8.

Figure 8:
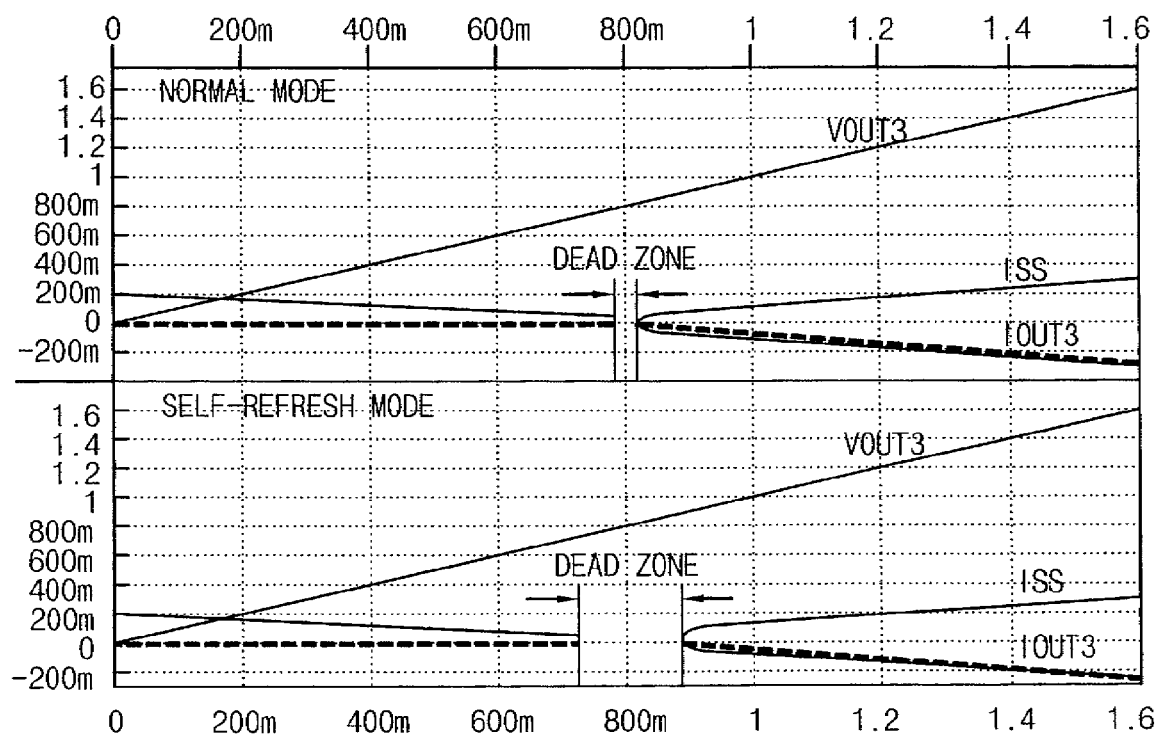
FIG. 8 is a waveform view of internal voltages according to modes based on the present invention.

In FIG. 8, reference sign "ISS" represents earth current, and reference sign "IOUT3" represents current corresponding to the internal voltage VOUT3.

As shown in FIG. 8, according to the embodiments of the present invention, the voltage level of a driving signal is controlled by the driving control unit 200 or 400, so that a wider dead zone is formed in a self-refresh operation, as compared with that formed in a normal operation.

Therefore, according to the embodiments of the present invention, in an operation (such as a self-refresh operation) of a memory device in which a change in the level of a power supply voltage or core voltage is small, the driving control unit 200 or 400 increases the dead zone of the internal voltage, so that unnecessary current consumption is reduced.

As described above, the internal voltage generation circuit according to the present invention widens the dead zone of the internal voltage in an operation of the memory device in which a change in voltage is small, thereby reducing unnecessary current consumption due to the control of the level of the internal voltage.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An internal voltage generation circuit comprising:
    a driving control unit for generating first and second driving signals to form a first dead zone, and third and fourth driving signals to form a second dead zone, based on a reference voltage having a target level between a first voltage and a second voltage, and selecting either one pair of the first and second driving signals or one pair of the third and fourth driving signals based on a control signal to control a dead zone; and
    a driving unit for driving the first and second voltage based on signals selected by the driving control unit, and outputting an internal voltage having a dead zone determined based on the signals selected by the driving control unit.

2. The internal voltage generation circuit as claimed in claim 1, wherein the first voltage includes either a core voltage or a power supply voltage, and the second voltage includes a ground voltage.

3. The internal voltage generation circuit as claimed in claim 1, wherein the driving control unit is provided with a self-refresh signal as the control signal.

4. The internal voltage generation circuit as claimed in claim 1, wherein the driving control unit comprises:
    a voltage divider for generating the first and second driving signals and the third and fourth driving signals by means of the reference voltage between the first and second voltages; and
    a selection unit for selecting either one pair of the first and second driving signals or one pair of the third and fourth driving signals based on the control signal.

5. The internal voltage generation circuit as claimed in claim 4, wherein the voltage divider comprises a plurality of resistor means which are serially connected between a power supply having the first voltage and a power supply having the second voltage, in which the reference voltage and the first to fourth driving signals are outputted from nodes connected between the each resistor means.

6. The internal voltage generation circuit as claimed in claim 4, wherein the voltage divider comprises a plurality of diode means which are serially connected between a power supply having the first voltage and a power supply having the second voltage, in which the reference voltage and the first to fourth driving signals are outputted from nodes connected between the each diode means.

7. The internal voltage generation circuit as claimed in claim 4, wherein the voltage divider generates the first driving signal having a higher level than the reference voltage, the third driving signal having a higher level than the first driving signal, a second driving signal having a lower level than the reference voltage, and a fourth driving signal having a lower level than the second driving signal.

8. The internal voltage generation circuit as claimed in claim 4, wherein the selection unit comprises:
    a first transistor connected between a node generating the first driving signal and a node generating the third driving signal, wherein the first transistor determines, based on the control signal, whether to transmit the third driving signal; and
    a second transistor connected between a node generating the second driving signal and a node generating the fourth driving signal, in which the second transistor determines, based on the control signal, whether to transmit the fourth driving signal.

9. The internal voltage generation circuit as claimed in claim 1, wherein the driving unit increases a level of the internal voltage by supplying the first voltage when a level of a signal selected by the driving control unit is increased, and decreases the level of the internal voltage by supplying the second voltage when a level of a signal selected by the driving control unit is decreased.

* * * * *